(12) United States Patent
Park et al.

(10) Patent No.: US 8,273,615 B2
(45) Date of Patent: Sep. 25, 2012

(54) THIN FILM TRANSISTOR AND METHOD OF FABRICATING THE SAME

(75) Inventors: Jae-Bum Park, Seoul (KR); Hyoung-Suk Jin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 12/314,507

(22) Filed: Dec. 11, 2008

(65) Prior Publication Data
US 2010/0006852 A1 Jan. 14, 2010

(30) Foreign Application Priority Data
Jul. 8, 2008 (KR) .................. 10-2008-0065818

(51) Int. Cl.
*H01L 21/00* (2006.01)
(52) U.S. Cl. ........ 438/164; 438/689; 438/713; 438/149; 438/151
(58) Field of Classification Search .................. 438/689, 438/713, 149, 151, 164
See application file for complete search history.

(56) References Cited

U.S. PATENT DOCUMENTS

| 6,709,910 | B1 * | 3/2004 | Crowder et al. | 438/197 |
| 7,727,824 | B2 * | 6/2010 | Yang et al. | 438/149 |
| 2006/0084243 | A1 * | 4/2006 | Zhang et al. | 438/478 |
| 2008/0003751 | A1 * | 1/2008 | Park et al. | 438/283 |
| 2008/0179600 | A1 * | 7/2008 | Takeguchi | 257/72 |
| 2009/0261337 | A1 * | 10/2009 | Sakakura et al. | 257/72 |

FOREIGN PATENT DOCUMENTS
JP 2000-031493 1/2000
* cited by examiner

*Primary Examiner* — Jae Lee
(74) *Attorney, Agent, or Firm* — Morgan, Lewis & Bockius LLP

(57) ABSTRACT

A thin film transistor includes a substrate; a semiconductor layer disposed on the substrate, the semiconductor layer having a source region, a drain region, and a channel region between the source region and the drain region; a gate insulating layer disposed on the semiconductor layer and on the substrate; and a gate electrode disposed on the insulating layer over the channel region, wherein the semiconductor layer includes tapered edge portions with a taper angle defined between the tapered edge portions and a surface of the substrate is less than about 30 degrees.

13 Claims, 16 Drawing Sheets

THIN FILM TRANSISTOR AND METHOD OF FABRICATING THE SAME

This application claims the benefit of Korean Patent Application No. 10-2008-0065818, filed on Jul. 8, 2008, which is hereby incorporated by reference in its entirety.

BACKGROUND OF THE INVENTION

1. Field of the Invention

The present application relates to a thin film transistor, and more particularly, to a polycrystalline silicon thin film transistor for a display device and a method of fabricating the polycrystalline silicon thin film transistor.

2. Discussion of the Related Art

Recently, as interest in information displays and demand for portable information media increase, flat panel displays (FPDs) have been the subject of research and commercialization in substitution for cathode ray tube (CRT) display devices. Among various FPDs, active matrix liquid crystal display (AM-LCD) devices having light weight, thin profile and low power consumption have been widely used for notebooks and monitors because of their superiority in display quality. The AM-LCD device includes a plurality of pixel regions each having a thin film transistor as a switching element to control a voltage to be applied to a liquid crystal layer of each pixel region, thereby changing transmittance of corresponding pixel region.

A liquid crystal display (LCD) device includes a liquid crystal panel to display images and a driving unit to supply signals to the liquid crystal panel. The liquid crystal panel includes two substrates facing each other and spaced apart from each other with a liquid crystal layer between the two substrates. The two substrates are usually referred to as an array substrate and a color filter substrate, respectively. The array substrate includes a plurality of gate lines parallel to and spaced apart from each other, a plurality of data lines crossing the plurality of gate lines to define a plurality of pixel regions, a plurality of thin film transistors (TFTs) each connected to each gate line and each data line, and a plurality of pixel electrodes each connected to a respective TFT.

The TFT used as a switching element of an LCD device may be classified into an amorphous silicon type and a polycrystalline silicon type according to a phase state of the active layer. Since carrier mobility of a TFT using polycrystalline silicon as an active layer is ten to one hundred times greater than that of a TFT using amorphous silicon as an active layer, a driving circuit including the polycrystalline silicon TFTs is typically used. Thus, the polycrystalline silicon TFT will be used as a switching element and a driving element for a display panel of next generation having high resolution.

In addition, the polycrystalline silicon TFT may be applied to an organic electroluminescent display (OELD) device, which is alternatively referred to as an organic light emitting diode (OLED) device, as a switching element. The OELD device includes first and second electrodes and an emitting layer between the first and second electrodes. Electrons and holes are injected into the emitting layer from the first and second electrodes, respectively, and the emitting layer emits light when excitons generated from combination of the electrons and the holes are transited from an excited state to a ground state. Since the emissive type OELD device does not require an additional light source, the OELD device has reduced volume and weight.

FIGS. 1A to 1D are cross-sectional views showing a method of fabricating a thin film transistor according to the related art. In FIG. 1A, a buffer layer 20 is formed on a substrate 10 having a pixel region PA. The pixel region PA, which is a unit for displaying images, includes a switching area SA for a thin film transistor (TFT) and the switching area SA includes a semiconductor area BA for an active layer. The semiconductor area BA includes a source area S, a drain area D and a channel area C. The buffer layer 20 includes an inorganic insulating material, such as silicon oxide ($SiO_2$) or silicon nitride (SiNx). Next, after an amorphous silicon layer (not shown) is formed on the buffer layer 20 using a plasma chemical vapor deposition (PCVD) method, the amorphous silicon layer is crystallized to be a polycrystalline silicon and the polycrystalline silicon is patterned to be an active layer 40 in the semiconductor area BA. The buffer layer 20 prevents contamination of the active layer 40 due to impurities from the substrate 10 during the deposition and crystallization steps. The amorphous silicon layer may be crystallized using one of excimer laser annealing (ELA) method, a solid phase crystallization (SPC) method, a sequential lateral solidification (SLS) method, a metal induced crystallization (MIC) method and an alternative magnetic lateral crystallization (AMLC) method.

In FIG. 1B, a gate insulating layer 45 is formed on the active layer 40. The gate insulating layer 45 includes an inorganic insulating material, such as silicon oxide ($SiO_2$) or silicon nitride (SiNx). Next, a gate electrode 25 and a gate line (not shown) are formed on the gate insulating layer 45 by depositing and patterning one of copper (Cu), molybdenum (Mo), aluminum (Al) and aluminum alloy. The gate electrode 25 is connected to the gate line and corresponds to the active layer 40, and a gate signal is applied to the gate electrode 25 through the gate line.

Although not shown in FIG. 1B, the active layer 40 corresponding to the source and drain areas S and D is doped with impurities having a negative type or a positive type using the gate electrode 25 as a doping mask to become a semiconductor layer 42. As a result, the semiconductor layer 42 includes a channel region 42a that does not have the impurities and first and second doped regions 42b and 42c having the impurities. The channel region 42a corresponds to the gate electrode 25 and the first and second doped regions 42b and 42c are disposed at both sides of the channel region 42a. Next, a passivation layer 55 is formed on the gate electrode 25 by depositing one of an inorganic insulating material, such as silicon oxide ($SiO_2$) or silicon nitride (SiNx), and an organic insulating material, such as photo acryl or benzocyclobutene (BCB).

In FIG. 1C, the passivation layer 55 and the gate insulating layer 45 are patterned to form a source hole SH and a drain hole DH exposing the semiconductor layer 42 corresponding to the source region S and the drain region D, respectively.

In FIG. 1D, a data line (not shown), a source electrode 32 and a drain electrode 34 are formed on the passivation layer 55. The data line crosses the gate line to define the pixel region PA. The source electrode 32 extends from the data line and the drain electrode 34 is spaced apart from the source electrode 32. The source and drain electrodes 32 and 34 are connected to the semiconductor layer 42 through the source and drain holes SH and DH, respectively. Next, an interlayer insulating layer 65 is formed on the data line, the source electrode 32 and the drain electrode 34. The interlayer insulating layer 65 has a drain contact hole DCH exposing the drain electrode 34. The interlayer insulating layer 65 includes one of an inorganic insulating material, such as silicon oxide ($SiO_2$) or silicon nitride (SiNx), and an organic insulating material, such as photo acryl or benzocyclobutene (BCB). Next, a pixel electrode 70 is formed on the interlayer insulating layer 65 in the pixel region PA. The pixel electrode 70 is connected to the drain electrode 34 through the drain contact hole DCH.

FIGS. 2A to 2D are cross-sectional views showing steps of forming an active layer and a gate insulating layer of FIGS. 1A and 1B for a thin film transistor according to the related art. In FIG. 2A, after an amorphous silicon layer (not shown) is formed on a buffer layer 20 by depositing amorphous silicon (a-Si:H) using a chemical vapor deposition (CVD) method, the amorphous silicon layer is crystallized to become a polycrystalline silicon layer 40a. Next, a photoresist (PR) layer 60 is formed on the polycrystalline silicon layer 40a and a photo mask M having a blocking portion T1 and a transmissive portion T2 is disposed over the PR layer 60. The blocking portion T1 is aligned to correspond to the semiconductor area BA and the transmissive portion T2 is aligned to correspond to the other areas. Since the blocking portion T1 shields light of an exposing apparatus (not shown) over the photo mask M and the transmissive portion T2 transmits the light, the PR layer 60 corresponding to the blocking portion T1 is not exposed to the light and the PR layer 60 corresponding to the transmissive portion T2 is exposed to the light to have a chemical transition.

In FIG. 2B, the light of the exposing apparatus is irradiated onto the PR layer 60 through the photo mask M to form a PR pattern 62 corresponding to the semiconductor area BA. Next, the polycrystalline silicon layer 40a is patterned using the PR pattern 62 as an etch mask by a dry etch method. For example, the polycrystalline silicon layer 40a may be etched by a plasma dry etch method using reaction gases, such as sulfur hexafluoride ($SF_6$), chlorine ($Cl_2$) and argon (Ar). During the dry etch step, the PR pattern 62, the polycrystalline silicon layer 40a and the buffer layer 20 have different etch rates for the reaction gases of sulfur hexafluoride ($SF_6$), chlorine ($Cl_2$), and argon (Ar). The PR pattern 62 and the buffer layer 20 have a first etch rate, and the polycrystalline silicon layer 40a has a second etch rate greater than the first etch rate. As a result, the PR pattern 62 and the buffer layer 20 are slowly etched, and the polycrystalline silicon layer 40a is quickly etched. Accordingly, deteriorations, such as an under etch phenomenon of the polycrystalline silicon layer 40a and an over etch phenomenon of the buffer layer 20, are prevented.

In FIG. 2C, the polycrystalline silicon layer 40a (of FIG. 2B) exposed through the PR pattern 62 is removed to form an active layer 40 having an island shape. Since the second etch rate of the polycrystalline silicon layer 40a for the reaction gases of sulfur hexafluoride ($SF_6$), chlorine ($Cl_2$) and argon (Ar) is relatively high, upper and lower portions of the polycrystalline silicon layer 40a adjacent to the PR pattern 62 are nearly completely removed and the active layer 40 has edge portions of a taper shape having a relatively steep slope instead of a relatively slow slope. For example, a taper angle θ, which a step coverage of a subsequent gate insulating layer 45 (of FIG. 1B) depends on, between side and bottom surfaces of the active layer 40 may be equal to or greater than about 80° (θ≧80°).

In FIG. 2D, a gate insulating layer 45 of an inorganic insulating material, such as silicon oxide ($SiO_2$) or silicon nitride (SiNx), is formed on an entire surface of the substrate 10 having the buffer layer 20 and the active layer 40 by a plasma chemical vapor deposition (PCVD) method using reaction gases such as mono silane ($SiH_4$) or tetraethylorthosilicate (TEOS). The TEOS has advantages such as harmlessness to human, easy handling and excellent chemical stability. As the step coverage of the gate insulating layer 45 at edge portions of the active layer 40 is improved, a breakdown voltage of the gate insulating layer 45 increases and a leakage current of the gate insulating layer 45 decreases. In addition, an electric property of the TFT depends on the breakdown voltage and the leakage current of the gate insulating layer 45. As a result, it is required for improved step coverage of the gate insulating layer 45 and an improved electric property of the TFT that the active layer 40 should have edge portions of a taper shape having a relatively slow slope.

Recently, as a degree of integration increases, the thickness of the active layer 40 has decreased to be about 300 Angstroms (Å). In addition, as the thickness of the active layer 40 is reduced, it is more difficult to form the active layer 40 having edge portions of a taper shape having a relatively slow slope. When the gate insulating layer 45 is formed on the active layer 40 having the taper angle θ equal to or greater than about 80 degrees, the gate insulating layer 45 may have deteriorations such as a crack at step difference portions F and G corresponding to the edge portions of the active layer 40. Further, since the breakdown voltage is reduced and the leakage current increases, reliability of the TFT is degraded.

FIG. 3 is a cross-sectional image showing an active layer and a gate insulating layer for a thin film transistor according to the related art. In FIG. 3, when a gate insulating layer 45 is formed on an active layer 40 by a plasma chemical vapor deposition (PCVD) method using tetraethylorthosilicate (TEOS), the gate insulating layer 45 has a bottom thickness Tb corresponding to a buffer layer 20, a top thickness Tt corresponding to a top portion of the active layer 40 and a side thickness Ts corresponding to an edge portion of the active layer 40. The bottom thickness Tb is substantially the same as the top thickness Tt (Tb/Tt≈0.99), and the side thickness Ts is substantially a half of the top thickness Tt (Ts/Tt≈0.52). When the gate insulating layer 45 is formed by a PCVD using mono silane ($SiH_4$), ratios of the bottom thickness Tb to the top thickness Tt and the side thickness Ts to the top thickness Tt are about 0.99 and about 0.75, respectively. (Tb/Tt≈0.99, Ts/Tt≈0.75) For example, when each of the bottom and top thicknesses Tb and Tt of the gate insulating layer 45 is about 500 Angstroms (Å), the side thickness Ts of the gate insulating layer 45 may be within a range of about 240 Angstroms (Å) to about 380 Angstroms (Å) due to a poor step coverage at the edge portion of the active layer 40. As a result, the gate insulating layer 45 may have a crack at step difference portions corresponding to the edge portion of the active layer 40, and the breakdown voltage and the leakage current of the TFT is degraded.

To improve the step coverage of the gate insulating layer 45 at the step difference portions thereof, the active layer 40 must have a tapered shape within a relatively slow slope at the edge portion thereof. However, since the thickness of the active layer is reduced to about 300 Angstroms (Å) to about 500 Angstroms (Å), limitations exist in obtaining a taper shape with a relatively slow slope.

SUMMARY OF THE INVENTION

Accordingly, the present invention is directed to a thin film transistor and a method of fabricating the thin film transistor that substantially obviates one or more of the problems due to limitations and disadvantages of the related art.

An object of the present invention is to provide a thin film transistor and a method of fabricating a thin film transistor where production yield increases due to improvement of a step coverage of a gate insulating layer and reliability of a thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a thin film transistor comprises a substrate; a semiconductor layer disposed on the substrate, the semiconductor layer having a source region, a drain region, and a channel region between the source region and the drain region; a gate insulating layer disposed on the semiconductor layer and on the substrate; and a gate electrode disposed on the insulating layer over the channel region, wherein the semiconductor layer includes tapered edge portions with a taper angle defined between the tapered edge portions and a surface of the substrate is less than about 30 degrees.

In another aspect, a method of manufacturing a thin film transistor comprises forming a silicon layer on a substrate; forming a photoresist layer on a portion of the silicon layer; performing a first etch process of the photoresist layer and the silicon layer wherein the etch rate of the photoresist in the first etch process is greater than that of the silicon layer; performing a second etch process of the photoresist layer and the silicon layer wherein the etch rate of the semiconductor layer is greater than that of the photoresist, and wherein the first and second etch processes form a silicon layer having an island shape with tapered edge portions and exposing adjacent portions of the substrate; and removing the remaining photoresist layer remaining after the first and second etch processes; forming a gate insulating layer on the silicon layer and the substrate; forming a gate electrode on the gate insulating layer over the silicon layer; and implanting impurities into the silicon layer to define source and drain regions and to define a channel region under the gate electrode.

In another aspect, a method of fabricating an array substrate for a liquid crystal display device comprises forming a silicon layer on a substrate; forming a photoresist layer on a portion of the silicon layer; performing a first etch process of the photoresist layer and the silicon layer wherein the etch rate of the photoresist in the first etch process is greater than that of the silicon layer; performing a second etch process of the photoresist layer and the silicon layer wherein the etch rate of the semiconductor layer is greater than that of the photoresist, and wherein the first and second etch processes form a silicon layer having an island shape with tapered edge portions and exposing adjacent portions of the substrate; and removing the remaining photoresist layer remaining after the first and second etch processes; forming a gate insulating layer on the silicon layer and the substrate; forming a gate line and gate electrode on the gate insulating layer, the gate electrode disposed over the silicon layer and connected to the gate line; implanting impurities into the silicon layer to define source and drain regions and to define a channel region under the gate electrode; forming an passivation layer on the gate electrode and the gate insulating layer; forming a data line, a source electrode and a drain electrode, the source electrode in contact with the source region via a first contact hole through the interlayer insulating layer; and forming an interlayer insulating layer on the data line, the source electrode and the drain electrode; and forming a pixel electrode on the interlayer insulating layer, the pixel electrode being connected to the drain electrode through the drain contact hole of the interlayer insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention. In the drawings.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 4:
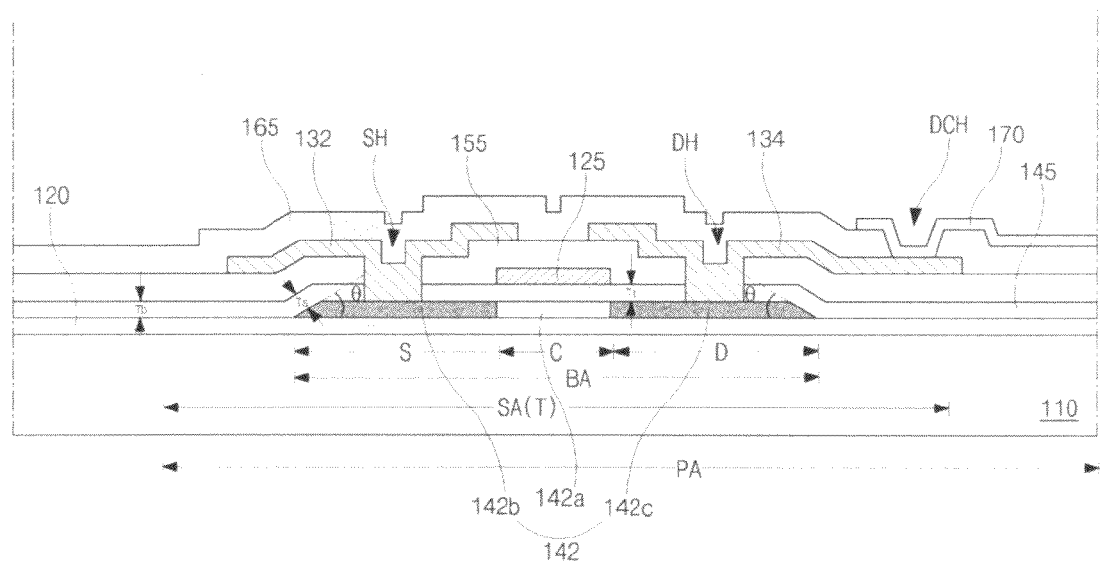
FIG. 4 is a cross-sectional view showing a thin film transistor according to an exemplary embodiment of the present invention.

FIG. 4 is a cross-sectional view showing a thin film transistor according to an embodiment of the present invention. In FIG. 4, a buffer layer 120 is formed on a substrate 110 including a semiconductor area BA having a source area S, a drain area D and a channel area C and a pixel region PA. A semiconductor layer 142 is formed on the buffer layer 120 in the semiconductor area BA. The semiconductor layer 142 includes edge portions having a tapered shape of a relatively slow slope. For example, a taper angle θ between side and bottom surfaces of the semiconductor layer 142 may be within a range of about 1 degree to about 30 degrees. Further, the semiconductor layer 142 includes a channel region 142a that does not have impurities therein and first and second doped regions 142b and 142c having the impurities of one of negative and positive types. The channel region 142a corresponds to the channel area C and the first and second doped regions 142b and 142c is disposed at both sides of the channel region 142a. A gate insulating layer 145 is formed on the semiconductor layer 142, and a gate electrode 125 is formed on the gate insulating layer 145 over the channel area C. In addition, a passivation layer 155 is formed on the gate electrode 125, and source and drain electrodes 132 and 134 are formed on the passivation layer 155. A source hole SH and a drain hole DH exposing the first and second doped regions 142b and 142c, respectively, are formed in the passivation layer 155 and the gate insulating layer 145. The source electrode 132 is connected to the first doped region 142b through the source hole SH and the drain electrode 134 is connected to the second doped region 142c through the drain hole DH. An interlayer insulating layer 165 is formed on the source and drain electrodes 132 and 134, and a pixel electrode 170 is formed on the interlayer insulating layer 165. The interlayer insulating layer 165 includes a drain contact hole DCH exposing the drain electrode 134 and the pixel electrode 170 is connected to the drain electrode 134 through the drain contact hole DCH.

The semiconductor layer 142 may be formed by depositing amorphous silicon (a-Si:H) layer (not shown), crystallizing the amorphous silicon layer to form a polycrystalline silicon layer and doping the polycrystalline silicon layer. The amorphous silicon layer may be crystallized using one of a solid phase crystallization (SPC) method, a sequential lateral solidification (SLS) method, a metal induced crystallization (MIC) method, a metal induced lateral crystallization (MILC) method and an alternative magnetic lateral crystallization (AMLC) method. Further, the buffer layer 120 prevents contamination of the semiconductor layer 142 due to impurities from the substrate 110 during the deposition and crystallization steps for the amorphous silicon layer. The semiconductor layer 142, the gate electrode 125, the source electrode 132 and the drain electrode 134 form a thin film transistor (TFT).

Although not shown in FIG. 4, the semiconductor layer 142 may have a rectangular shape having four edge portions. Although the semiconductor layer 142 has a thickness equal to or smaller than about 300 Angstrom (Å), the four edge portions of the semiconductor layer 142 have a tapered shape of a relatively slow slope. Accordingly, the gate insulating layer 145 and the passivation layer 155 covering the semiconductor layer 142 have excellent step coverage. For example, when the gate insulating layer 145 has a bottom thickness Tb corresponding to the buffer layer 120, a top thickness Tt corresponding to a top portion of the semiconductor layer 142 and a side thickness Ts corresponding to an edge portion of the semiconductor layer 142, a ratio of the bottom thickness Tb to the top thickness Tt is about 0.99 (Tb/Tt≈0.99) and a ratio of the side thickness Ts to the top thickness Tt is about 0.92 (Ts/Tt≈0.92). Since the differences among the bottom, top and side thicknesses Tb, Tt and Ts are minimized, the gate insulating layer 145 has a uniform thickness and excellent step coverage of the gate insulating layer 145 is obtained. As a result, deterioration due to poor step coverage of the gate insulating layer 145 at the edge portions is prevented and properties of the TFT are improved, thereby increasing a breakdown voltage and decreasing leakage current of the TFT.

FIGS. 5A to 5G are cross-sectional views showing a method of fabricating a thin film transistor according to an exemplary embodiment of the present invention.

Figure 5A:
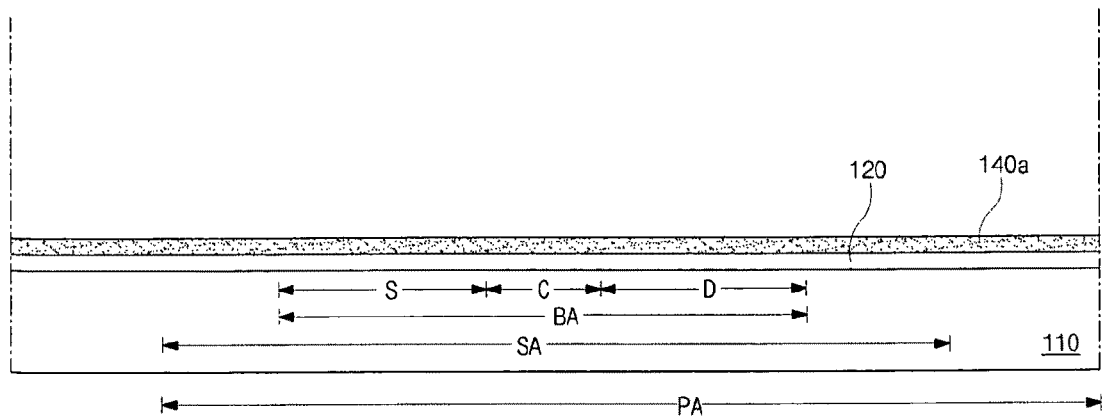
FIGS. 5A to 5G are cross-sectional views showing a method of fabricating a thin film transistor according to an exemplary embodiment of the present invention.

In FIG. 5A, a buffer layer 120 is formed on a substrate 110 having a pixel region PA by depositing an inorganic insulating material, such as silicon oxide ($SiO_2$) or silicon nitride (SiNx). The pixel region PA, which is a unit for displaying images, includes a switching area SA for a thin film transistor (TFT), and the switching area SA includes a semiconductor area BA for an active layer. The semiconductor area BA includes a source area S, a drain area D and a channel area C. Next, an amorphous silicon layer 140a is formed on the buffer layer 120 by a plasma chemical vapor deposition (PCVD) method using amorphous silicon (a-Si:H).

Figure 5B:
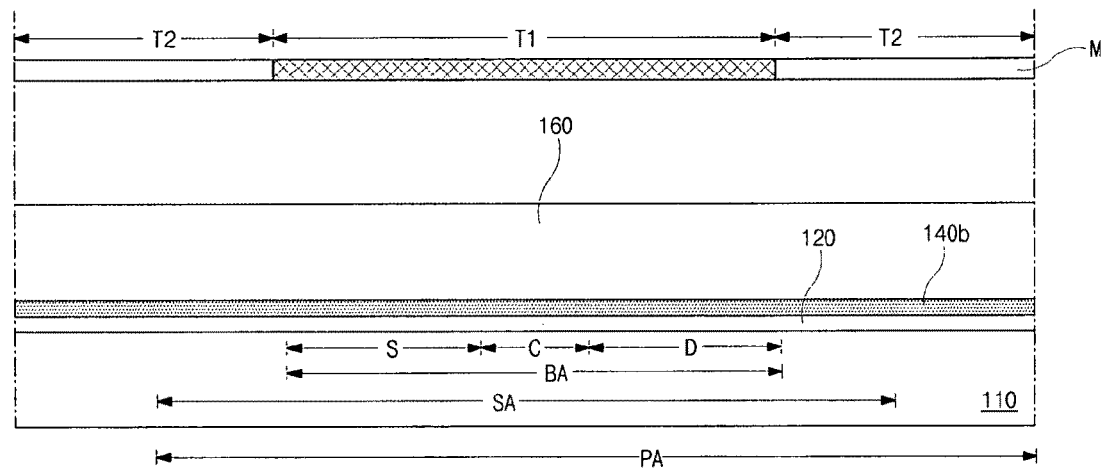

In FIG. 5B, the amorphous silicon layer 140a (of FIG. 5A) is crystallized to become a polycrystalline silicon layer 140b. The amorphous silicon layer 140a may be crystallized using one of a solid phase crystallization (SPC) method, a sequential lateral solidification (SLS) method, a metal induced crystallization (MIC) method, a metal induced lateral crystallization (MILC) method and an alternative magnetic lateral crystallization (AMLC) method. For example, the polycrystalline silicon layer 140b may have a thickness of about 300 Angstroms (Å). Next, a photoresist (PR) layer 160 is formed on the polycrystalline silicon layer 140b, and a photo mask M having a blocking portion T1 and a transmissive portion T2 is disposed over the PR layer 160. The blocking portion T1 is aligned to correspond to the semiconductor area BA and the transmissive portion T2 is aligned to correspond to the other areas. For example, since the blocking portion T1 shields light of an exposing apparatus (not shown) over the photo mask M and the transmissive portion T2 transmits the light, the PR layer 160 of a negative type corresponding to the blocking portion T1 is not exposed to the light, and the PR layer 160 of a negative type corresponding to the transmissive portion T2 is exposed to the light to have a chemical transition.

Figure 5C:
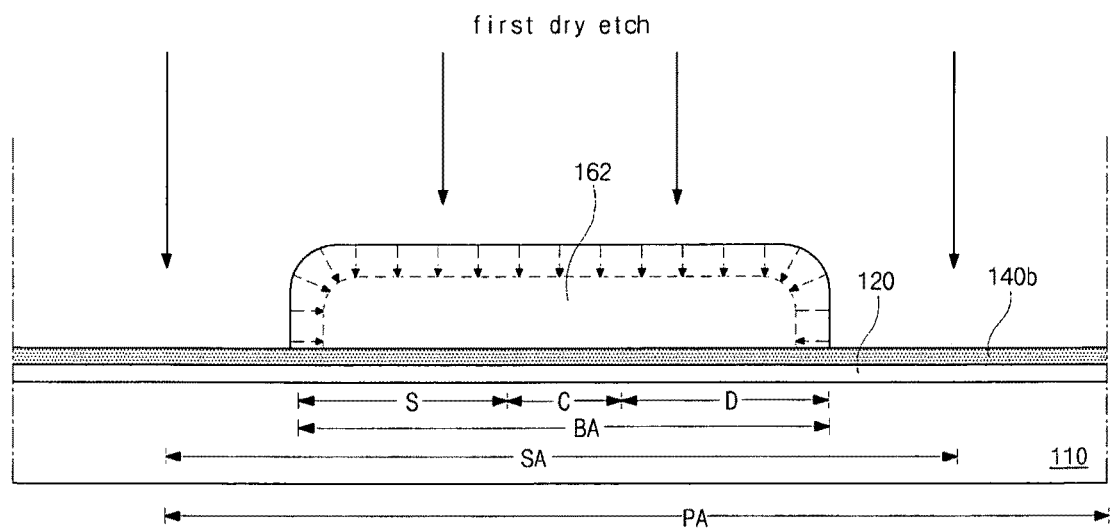

In FIG. 5C, the light of the exposing apparatus is irradiated onto the PR layer 160 through the photo mask M (of FIG. 5B) and the PR layer 160 is developed such that a non-irradiated portion of the PR layer 160 remains to form a PR pattern 162 corresponding to the semiconductor area BA and an irradiated portion of the PR layer 160 is removed to expose the polycrystalline silicon layer 140b. The PR pattern 162 may be hardened by a hard baking step. At the same time, edge portions of the PR pattern 162 may be rounded by the hard baking step. Next, the polycrystalline silicon layer 140b is patterned using the PR pattern 162 as an etch mask through a first dry etch step, which is a preparation step for forming a taper shape of the semiconductor layer 142 (of FIG. 4).

A plasma dry etching method using first reaction gases, such as carbon tetra fluorine ($CF_4$), oxygen ($O_2$) and argon (Ar), may be applied to the first dry etch step. For example, when the polycrystalline silicon layer 140b has a thickness of about 2000 Å, the first dry etching step may have process conditions such as a pressure of about 50 mT to about 100 mT, a power of about 3000 W, a carbon tetra fluorine ($CF_4$) flow rate of about 200 sccm to about 600 sccm, an oxygen ($O_2$) flow rate of about 500 sccm to about 800 sccm and an etch rate of about 510 Å/min to about 1200 Å/min for the polycrystalline silicon layer 140b. During the first dry etch step using the first reaction gases such as carbon tetra fluorine ($CF_4$), oxygen ($O_2$) and argon (Ar), the PR pattern 162, the polycrystalline silicon layer 140b and the buffer layer 120 have different etch rates. For example, the etch rate of photoresist for the first reaction gases of carbon tetra fluorine ($CF_4$), oxygen ($O_2$) and argon (Ar) may be greater than the etch rate of each of silicon (Si), silicon oxide ($SiO_2$) or silicon nitride (SiNx). As a result, the PR pattern 162 may have a first etch rate, and the polycrystalline silicon layer 140b and the buffer layer 120 may have a second etch rate smaller than the first etch rate. Since the polycrystalline silicon layer 140b is etched more slowly than the PR pattern 162 during the first dry etch step, the polycrystalline silicon layer 140b is etched such that a thickness of the removed polycrystalline silicon layer 140b is smaller than a thickness of the removed PR pattern 162.

Figure 5D:
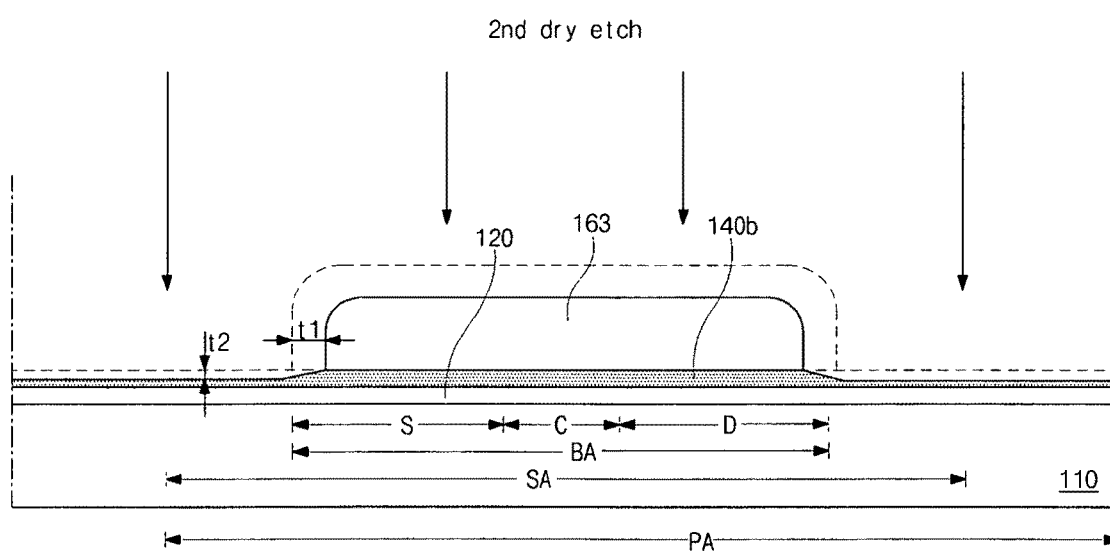

In FIG. 5D, while a portion of the PR pattern 162 having a first thickness t1 is removed to form a remaining PR pattern 163, a portion of the polycrystalline silicon layer 140b having a second thickness t2 smaller than the first thickness t1 (t2<t1) is removed after the first dry etch step. Since a portion of the polycrystalline silicon layer 140b under the removed portion of the PR pattern 162 is exposed to the first reaction gases for different etch time periods according to a distance from an edge of the remaining PR pattern 163, the portion of the polycrystalline silicon layer 140b under the removed portion of the PR pattern 162 has a slant surface having different thicknesses. For example, the slant surface may correspond to an oblique side of a right triangle having a bottom side of the first thickness t1 and a height of the second thickness t2. Further, the second thickness t2 may be within a range of about 70% to about 90% of an original thickness of the polycrystalline silicon layer 140b. Accordingly, a portion within a range of about 70% to about 90% of the polycrystalline silicon layer 140b is removed through the first etch step. For example, the polycrystalline silicon layer 140b having the second thickness t2 that is about 80% of the original thickness may be removed during the first dry etch step.

After the first dry etch step, the polycrystalline silicon layer 140b is patterned using the remaining PR pattern 163 as an etch mask through a second dry etch step. A plasma dry etching method using second reaction gases, such as sulfur hexafluoride ($SF_6$), chlorine ($Cl_2$) and argon (Ar), may be applied for the second dry etch step. During the second dry etch step using the second reaction gases of sulfur hexafluoride ($SF_6$), chlorine ($Cl_2$) and argon (Ar), the remaining PR pattern 163, the polycrystalline silicon layer 140b and the buffer layer 120 have different etch rates. For example, the remaining PR pattern 163 and the buffer layer 120 may have a third etch rate, and the polycrystalline silicon layer 140b has a fourth etch rate greater than the third etch rate. As a result, the remaining PR pattern 163 and the buffer layer 120 are slowly etched, and the polycrystalline silicon layer 140b is quickly etched. In addition, the third etch rate of the second etch step may be smaller than the first etch rate of the first etch step, and the fourth etch rate of the second etch step may be substantially the same as the second etch rate of the first etch step.

The etch time period for the second etch step is determined by the thickness of a remaining portion of the polycrystalline silicon layer 140b. For example, the second etch step may be performed for several seconds so that the slant surface of the polycrystalline silicon layer 140b can be kept. After the polycrystalline silicon layer 140b is patterned through the second etch step, the remaining PR pattern 163 may be removed by an ashing method or a stripping method.

Figure 5E:
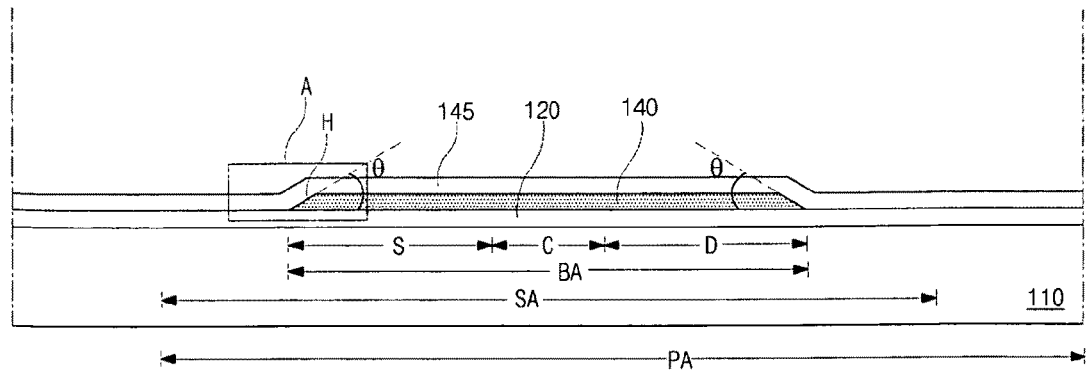

In FIG. 5E, an active layer 140 having an island shape is formed on the buffer layer 120 by patterning the polycrystalline silicon layer 140b (of FIG. 5D) through the first and second etch steps. The active layer 140 corresponds to the semiconductor area BA and has edge portions A of a taper shape having a relatively slow slope. The tapered shape has a taper angle θ between side and bottom surfaces of the active layer 140 within a range of about 1 degree to about 30 degrees. For example, the active layer 140 may have a taper angle θ of about 10 degrees to about 15 degrees that depends on the first and second thicknesses t1 and t2 (of FIG. 5D).

Figure 1A:
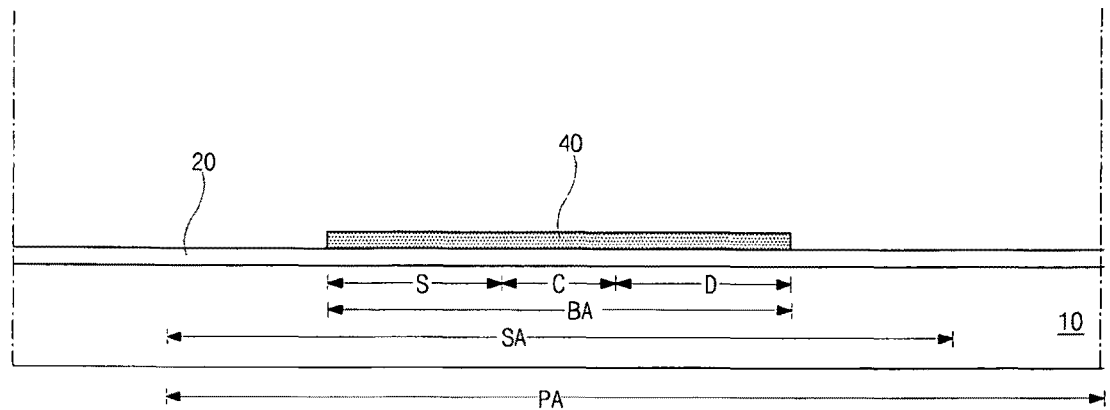
FIGS. 1A to 1D are cross-sectional views showing a method of fabricating a thin film transistor according to the related art.
Figure 1B:
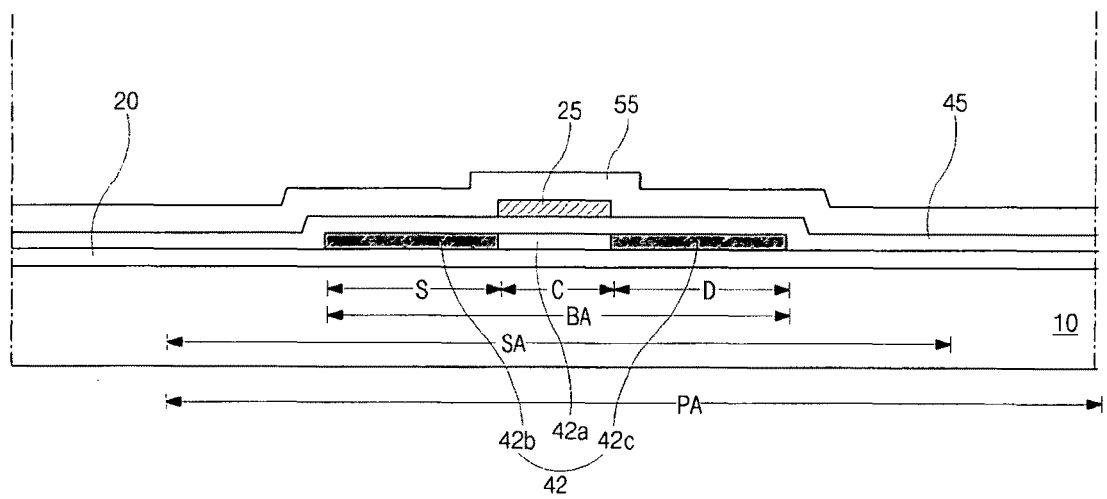
Figure 1C:
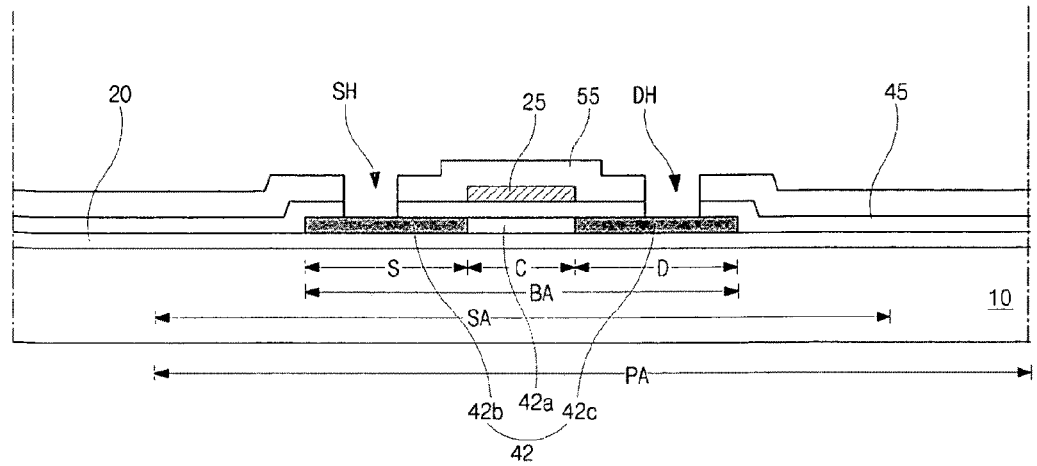
Figure 1D:
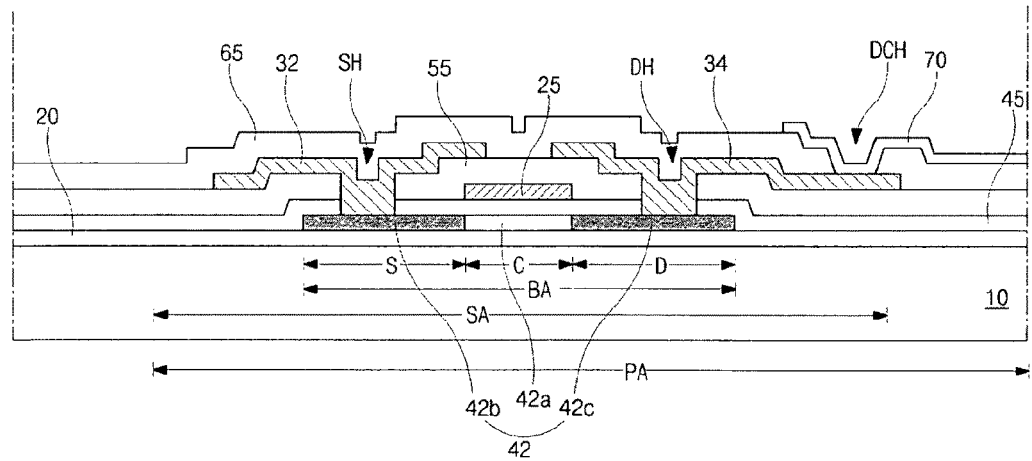
Figure 2A:
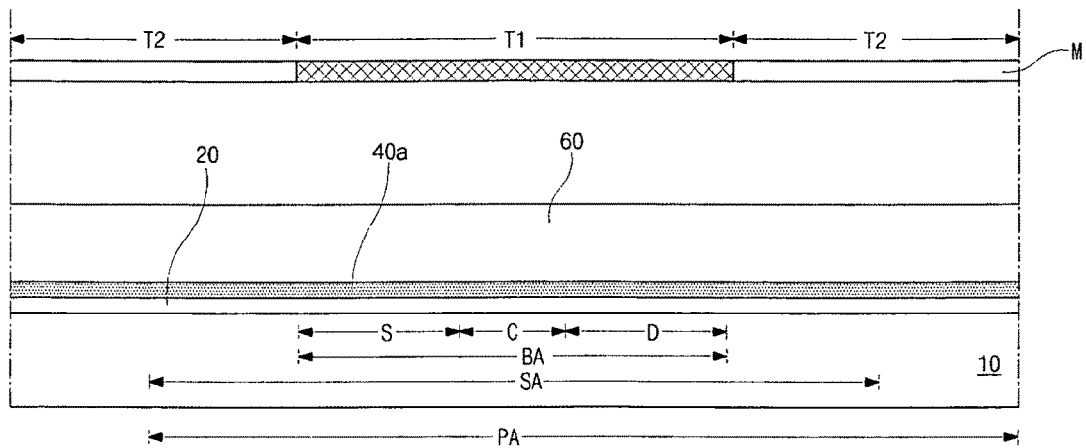
FIGS. 2A to 2D are cross-sectional view showing the steps of forming the active layer and the gate insulating layer of FIGS. 1A and 1B for a thin film transistor according to the related art.
Figure 2B:
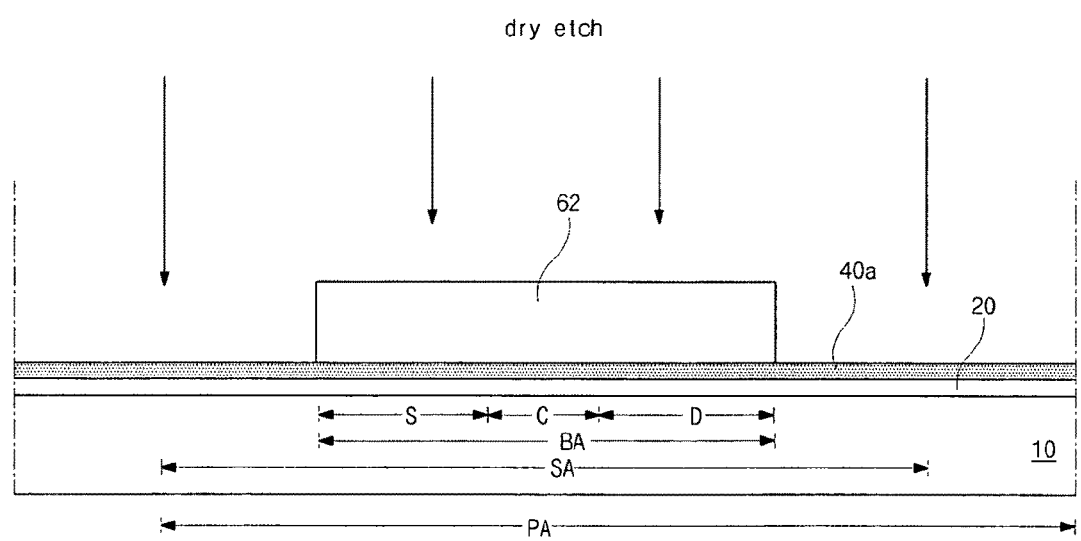
Figure 2C:
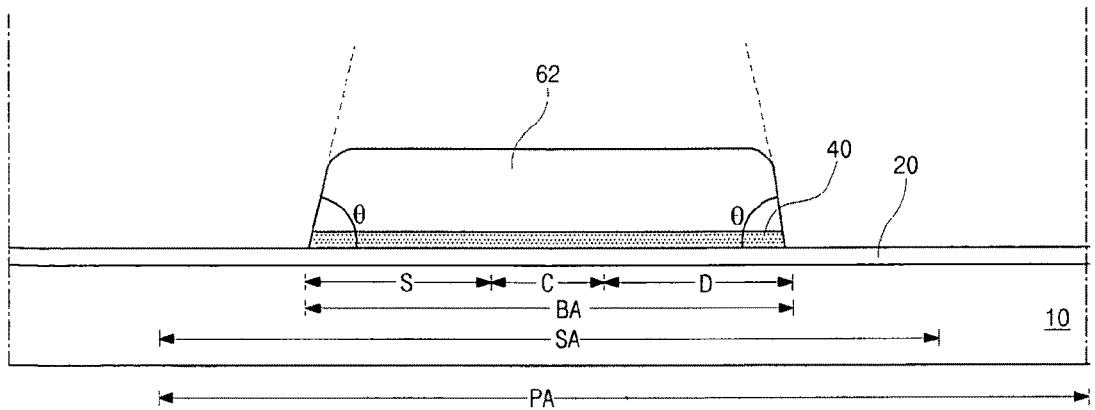
Figure 2D:
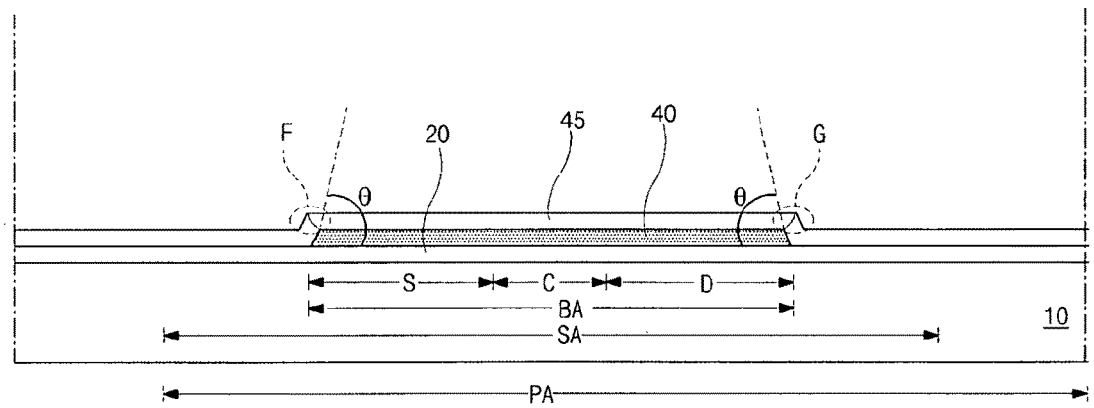
Figure 3:
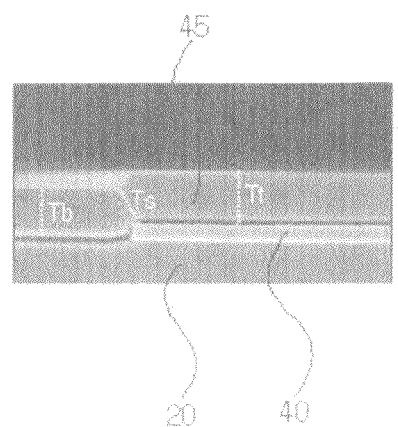
FIG. 3 is a cross-sectional image showing an active layer and a gate insulating layer for a thin film transistor according to the related art.

Next, a gate insulating layer 145 of an inorganic insulating material, such as silicon oxide ($SiO_2$) or silicon nitride (SiNx), is formed on an entire surface of the substrate 110 having the buffer layer 120 and the active layer 140 by a plasma chemical vapor deposition (PCVD) method using reaction gases, such as mono silane ($SiH_4$) or tetraethylorthosilicate (TEOS). Since the active layer 140 has a taper shape of a relatively slow slope having a taper angle of about 1 degree to about 30 degrees, a step coverage of the gate insulating layer 145 at the edge portions A of the active layer 140 is improved such that the gate insulating layer 145 has substantially the same thickness over the active layer 140 including a slant surface H of the edge portion A. As a result, properties of a TFT T (of FIG. 4) are improved such that a breakdown voltage increases and a leakage current decreases. For example, the gate insulating layer 145 has improved breakdown voltage of about 85V as compared the gate insulating layer 45 (of FIG. 1B) of the related art having a breakdown voltage of about 62V.

Figure 5F:
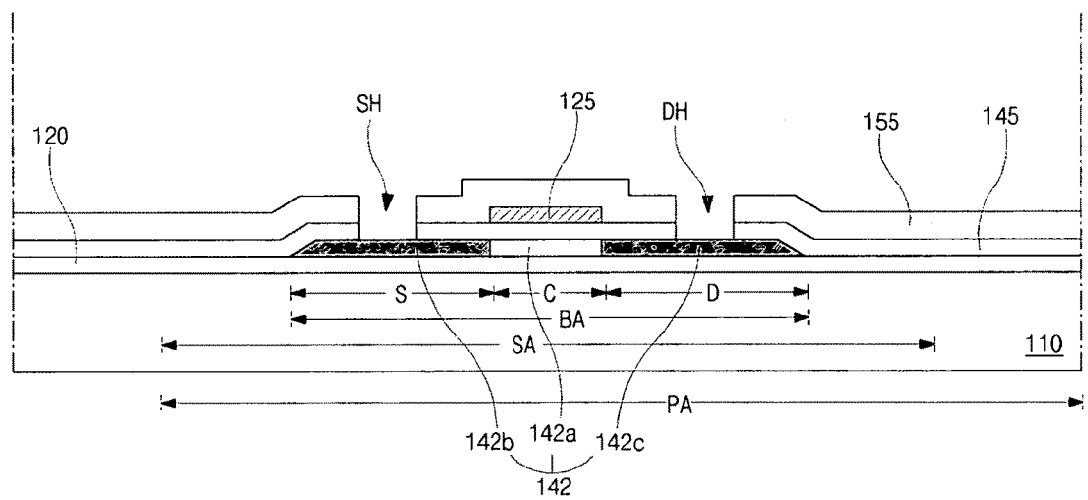

In FIG. 5F, a gate electrode 125 and a gate line (not shown) are formed on the gate insulating layer 145 by depositing and patterning one of copper (Cu), molybdenum (Mo), aluminum (Al) and aluminum alloy. The gate electrode 125 is connected to the gate line and corresponds to the active layer 140 in the channel area C, and a gate signal is applied to the gate electrode 125 through the gate line.

Although not shown in FIG. 5F, a semiconductor layer 142 is formed by doping the active layer 140 corresponding to the source and drain areas S and D with impurities of a negative type or a positive type using the gate electrode 125 as a doping mask. As a result, the semiconductor layer 142 includes a channel region 142a that does not have the impurities and first and second doped regions 142b and 142c having the impurities. The channel region 142a corresponds to the gate electrode 125 and the first and second doped regions 142b and 142c are disposed at both sides of the channel region 142a.

Next, a passivation layer 155 is formed on the gate electrode 125 by depositing one of an inorganic insulating material, such as silicon oxide ($SiO_2$) silicon nitride (SiNx), or an organic insulating material, such as photo acryl or benzocyclobutene (BCB). Alternatively, the passivation layer 155 may have a double-layered structure including a first layer, for example, of silicon nitride (SiNx) and a second layer of silicon oxide ($SiO_2$). Next, a source hole SH and a drain hole DH are formed in the passivation layer 155 and the gate insulating layer 145 by patterning. The source hole SH and the drain hole DH expose the first doped region 142b and the second doped region 142c, respectively, of the semiconductor layer 142.

Figure 5G:
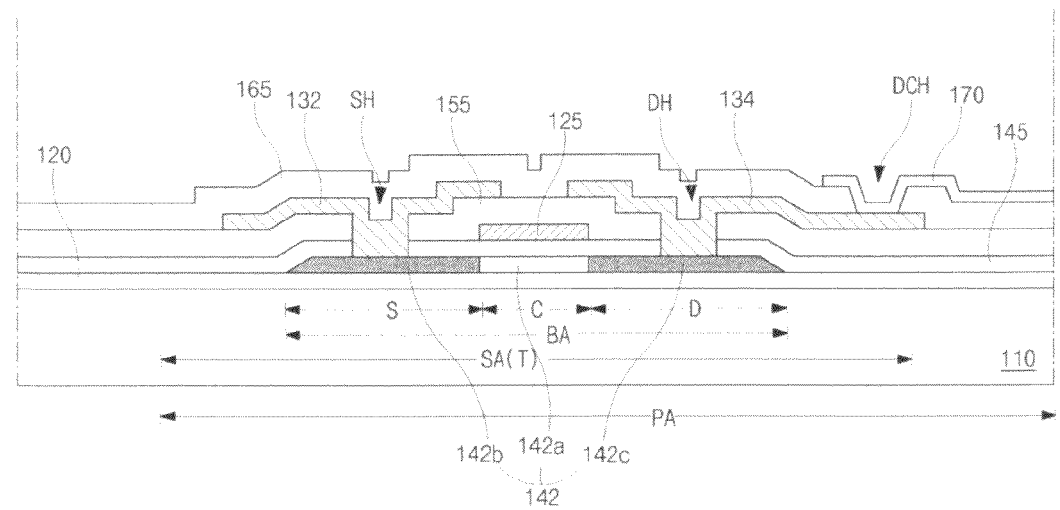

In FIG. 5G, a data line (not shown), a source electrode 132 and a drain electrode 134 are formed on the passivation layer 155. The data line crosses the gate line to define the pixel region PA. The source electrode 132 extends from the data line and the drain electrode 134 is spaced apart from the source electrode 132. The source electrode 132 is connected to the first doped region 142b of the semiconductor layer 142 through the source hole SH, and the drain electrode 134 is connected to the second doped region 142c of the semiconductor layer 142 through the drain hole DH.

Next, an interlayer insulating layer 165 is formed on the data line, the source electrode 132 and the drain electrode 134. The interlayer insulating layer 165 has a drain contact hole DCH exposing the drain electrode 134. The interlayer insulating layer 165 includes one of an inorganic insulating material, such as silicon oxide ($SiO_2$) or silicon nitride (SiNx), and an organic insulating material, such as photo acryl or benzocyclobutene (BCB). Next, a pixel electrode 170 is formed on the interlayer insulating layer 165 in the pixel region PA by depositing and patterning a transparent conductive material, such as indium-tin-oxide (ITO) or indium-zinc-oxide (IZO). The pixel electrode 170 is connected to the drain electrode 134 through the drain contact hole DCH.

Figure 6:
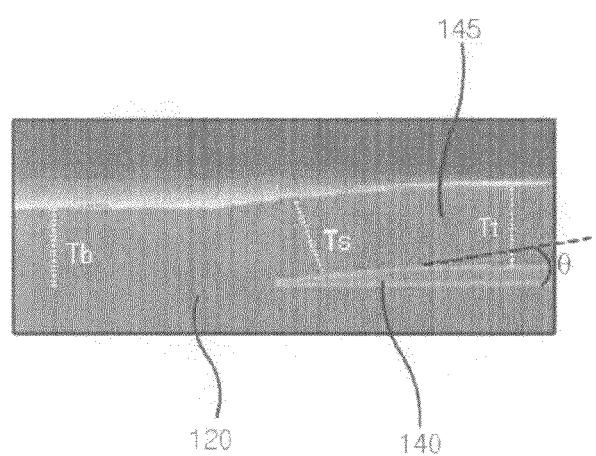
FIG. 6 is a cross-sectional image showing an active layer and a gate insulating layer for a thin film transistor according to an exemplary embodiment of the present invention.

FIG. 6 is a cross-sectional image showing an active layer and a gate insulating layer for a thin film transistor according to an exemplary embodiment of the present invention. FIG. 6 is a scanning electron microscope (SEM) image corresponding to the edge portion A of FIG. 5E.

In FIG. 6, an active layer 140 is formed on a buffer layer 120 and a gate insulating layer 145 is formed on the active layer 140. An edge portion of the active layer 140 has a tapered shape whose taper angle θ is within a range of about 1 degree to about 30 degree. The gate insulating layer 145 has a bottom thickness Tb corresponding to the buffer layer 120, a top thickness Tt corresponding to a top portion of the active layer 140 and a side thickness Ts corresponding to the edge portion of the active layer 140. Since the edge portion of the active layer 140 has a taper shape of a relatively slow slope, the bottom, top and side thicknesses Tb, Tt and Ts are substantially the same as one another (Tb≈Tt≈Ts). As a result, the gate insulating layer 145 has excellent step coverage, and properties of the TFT T (of FIG. 4) are improved, thereby increasing breakdown voltage and decreasing leakage current of the TFT.

FIGS. 7A to 7I are cross-sectional views showing a method of fabricating a thin film transistor according to another exemplary embodiment of the present invention, and FIGS. 8A to 8D are scanning electron microscope (SEM) images showing surface morphologies of a polycrystalline silicon layer for a thin film transistor according to another exemplary embodiment of the present invention.

Figure 7A:
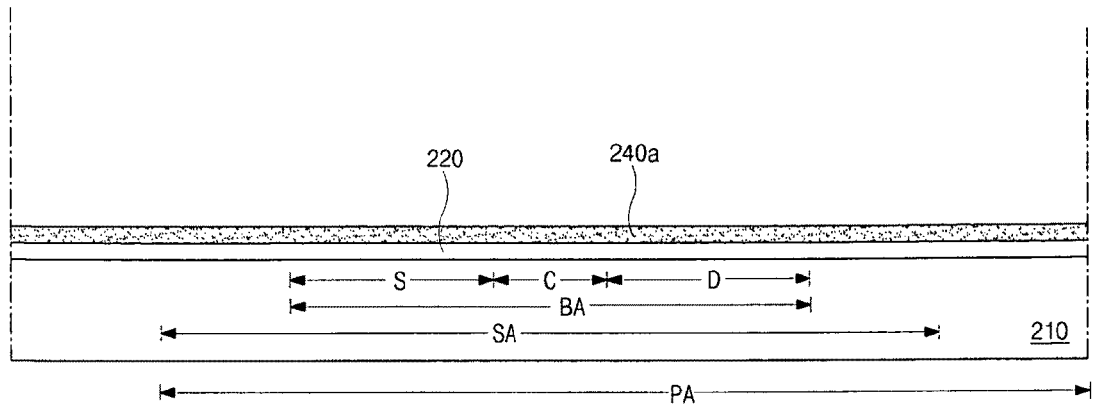
FIGS. 7A to 7I are cross-sectional views showing a method of fabricating a thin film transistor according to another exemplary embodiment of the present invention.

In FIG. 7A, a buffer layer 220 is formed on a substrate 210 having a pixel region PA by depositing an inorganic insulating material, such as silicon oxide ($SiO_2$) or silicon nitride ($SiN_x$). The pixel region PA, which is a unit for displaying images, includes a switching area SA for a thin film transistor (TFT) and the switching area SA includes a semiconductor area BA for an active layer. The semiconductor area BA includes a source area S, a drain area D and a channel area C. Next, an amorphous silicon layer 240a is formed on the buffer layer 220 by a plasma chemical vapor deposition (PCVD) method using amorphous silicon (a-Si:H).

Figure 7B:
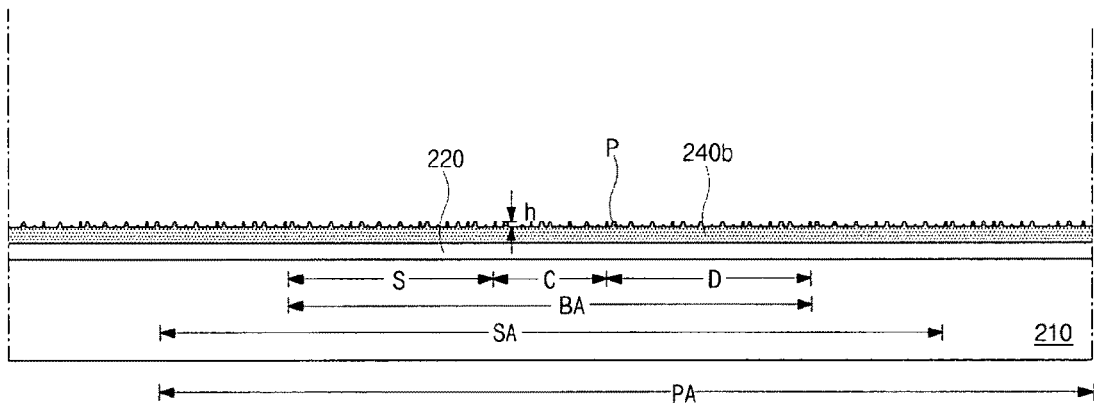

In FIG. 7B, the amorphous silicon layer 240a (of FIG. 7A) is crystallized to become a polycrystalline silicon layer 240b. The amorphous silicon layer 240a may be crystallized using an excimer laser annealing (ELA) method. The polycrystalline silicon layer 240b crystallized by an ELA method may have a plurality of protrusions P on a top surface thereof. Each protrusion P may have a height h from the flat top surface of the polycrystalline silicon layer 240b. In an ELA method, the amorphous silicon layer 240a is melted to have a liquid phase and the liquid amorphous silicon layer 240a is solidified to become the polycrystalline silicon layer 240b. When the liquid amorphous silicon layer 240a is solidified, grain boundaries of the polycrystalline silicon layer 240b protrudes to form the plurality of protrusions P having silicon (Si) or silicon oxide ($SiO_x$). The plurality of protrusions may remain to be a residue causing an electric shortage even after the polycrystalline silicon layer 240b is patterned and may cause deterioration, such as a crack in a subsequent gate insulating layer. Accordingly, the plurality of protrusions P may be removed by an additional etch step using a buffer oxide etchant (BOE), i.e., a BOE treatment step.

Figure 7C:
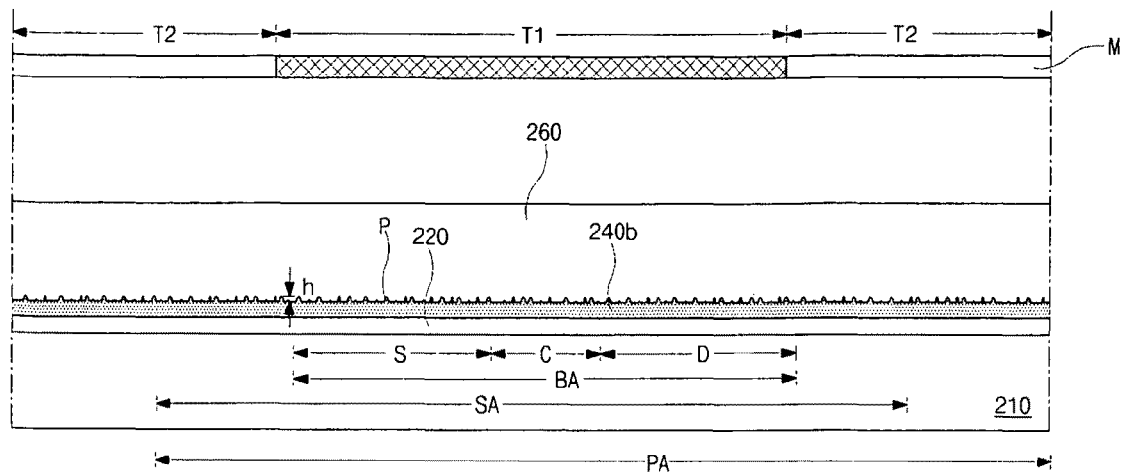

In FIG. 7C, a photoresist (PR) layer 260 is formed on the polycrystalline silicon layer 240b, and a photo mask M having a blocking portion T1 and a transmissive portion T2 is disposed over the PR layer 260. The blocking portion T1 is aligned to correspond to the semiconductor area BA and the transmissive portion T2 is aligned to correspond to the other areas. For example, since the blocking portion T1 shields light of an exposing apparatus (not shown) over the photo mask M and the transmissive portion T2 transmits the light, the PR layer 260 of a negative type corresponding to the blocking portion T1 is not exposed to the light and the PR layer 260 of a negative type corresponding to the transmissive portion T2 is exposed to the light to have a chemical transition.

Figure 7D:
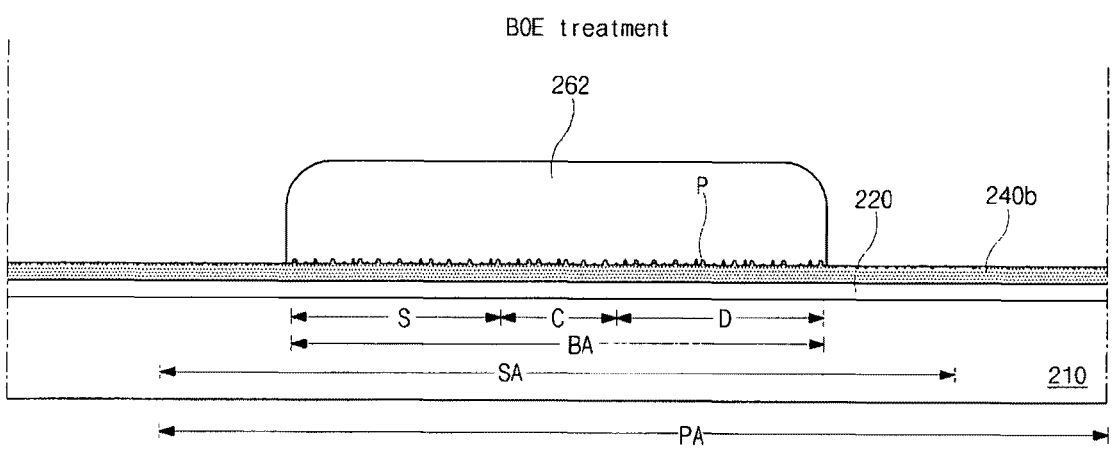

In FIG. 7D, the light of the exposing apparatus is irradiated onto the PR layer 260 through the photo mask M (of FIG. 7C) and the PR layer 260 is developed such that a non-irradiated portion of the PR layer 260 remains to form a PR pattern 262 corresponding to the semiconductor area BA and an irradiated portion of the PR layer 260 is removed to expose the polycrystalline silicon layer 240b. The PR pattern 262 may be hardened by a hard baking step. At the same time, edge portions of the PR pattern 262 may be rounded by the hard baking step.

Next, the polycrystalline silicon layer 240b is slightly etched by a buffer oxide etchant (BOE) to remove the plurality of protrusions P. For example, the BOE may be applied to the polycrystalline silicon layer 240b having the plurality of protrusions P and the PR pattern 262 during a predetermined time period and the plurality of protrusions P outside the PR pattern 262 may be removed by the BOE. As a result, the polycrystalline silicon layer 240b exposed outside the PR pattern 262 has a flat top surface without protrusions.

Figure 8A:
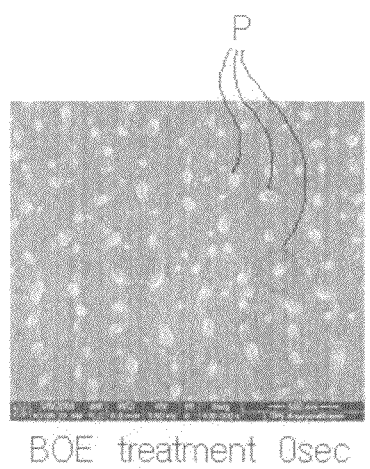
FIGS. 8A to 8D are plan scanning electron microscope (SEM) images showing surface morphologies of a polycrystalline silicon layer for a thin film transistor according to another exemplary embodiment of the present invention.
Figure 8B:
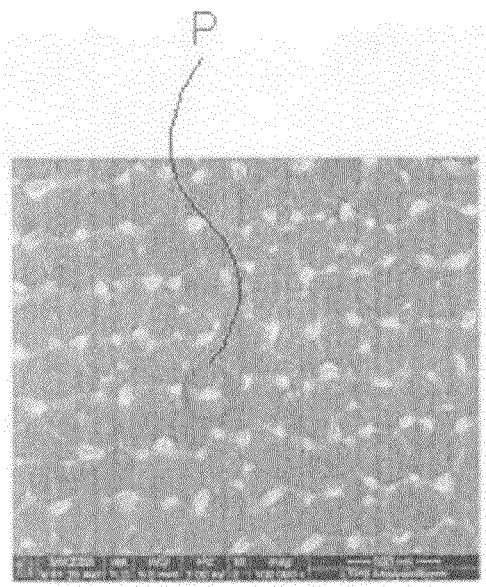
Figure 8C:
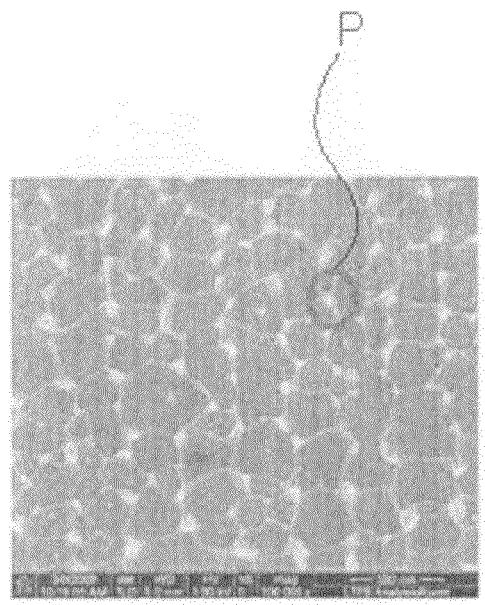
Figure 8D:
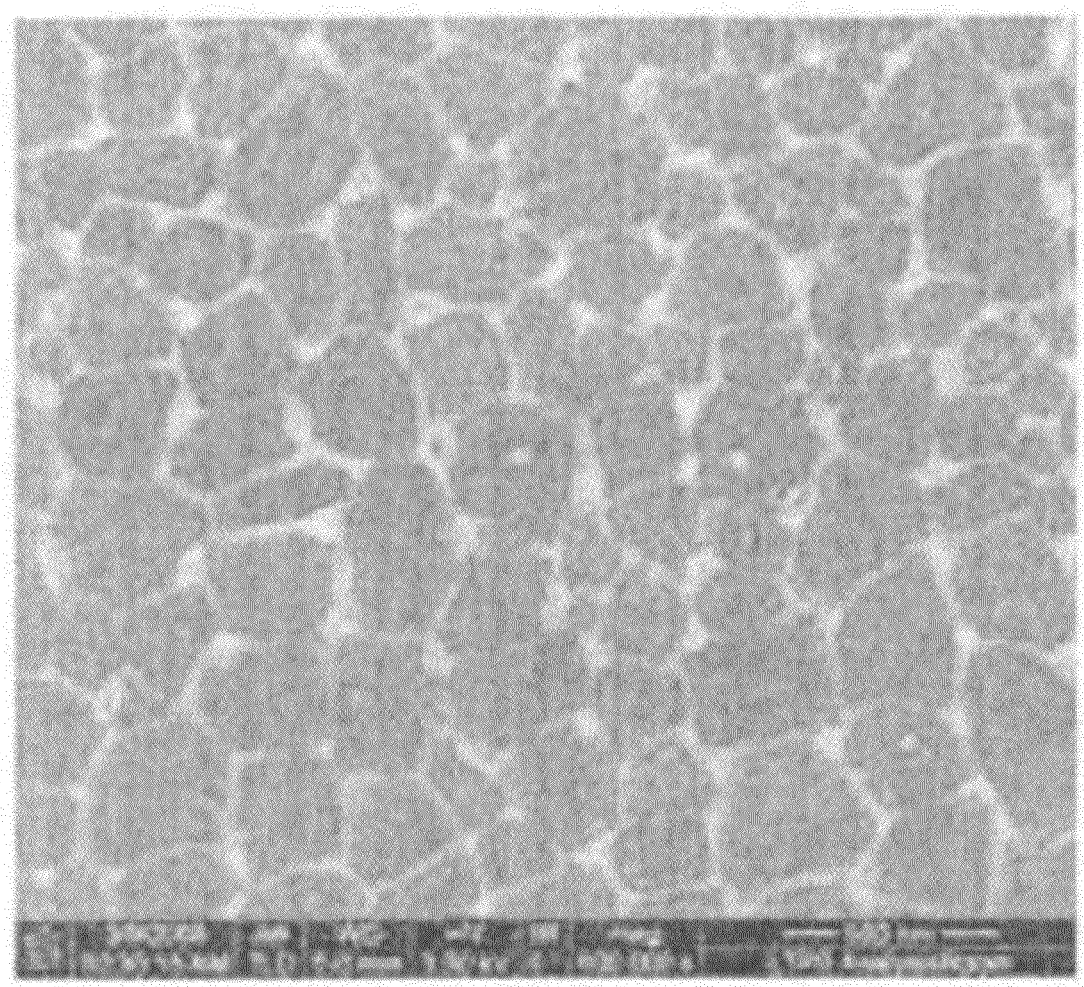

As shown in FIG. 8A, when the BOE treatment is not performed to the polycrystalline silicon layer 240b, the plurality of protrusions P are disposed at the grain boundaries of the polycrystalline silicon layer 240b. As the time period for the BOE treatment increases from about 50 sec of FIG. 8B to about 100 sec of FIG. 8C, the size of each protrusion P is reduced. In addition, when the BOE treatment is performed for about 150 sec, most of the plurality of protrusions P are removed in FIG. 8D. As a result, the BOE treatment may be performed for about 100 sec to about 200 sec, e.g., about 150 sec.

Figure 7E:
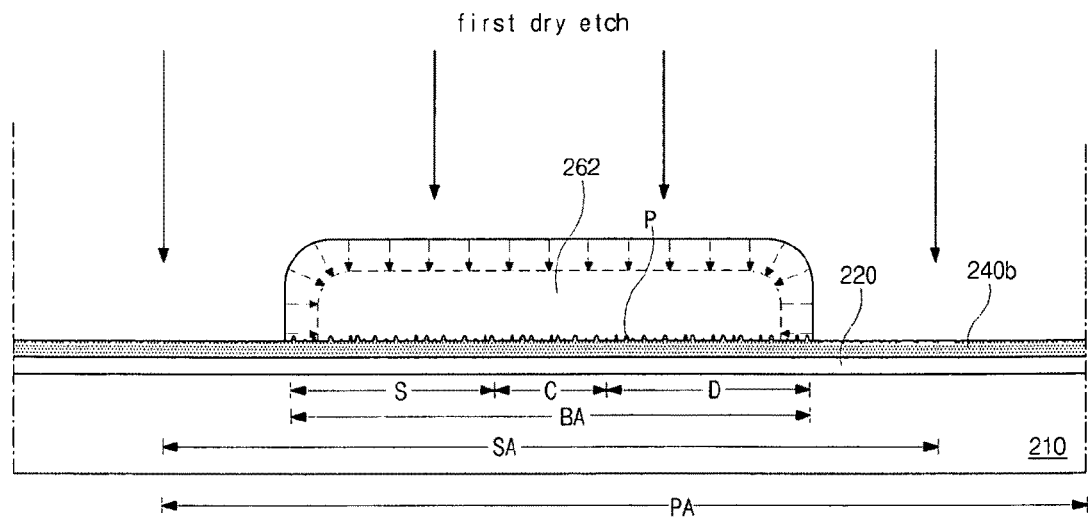
Figure 7F:
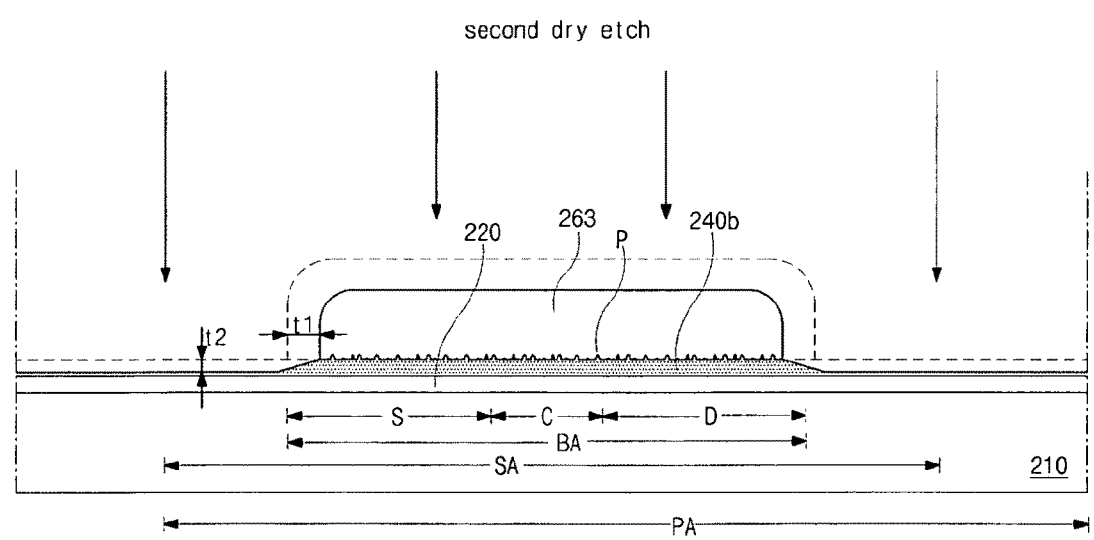
Figure 7G:
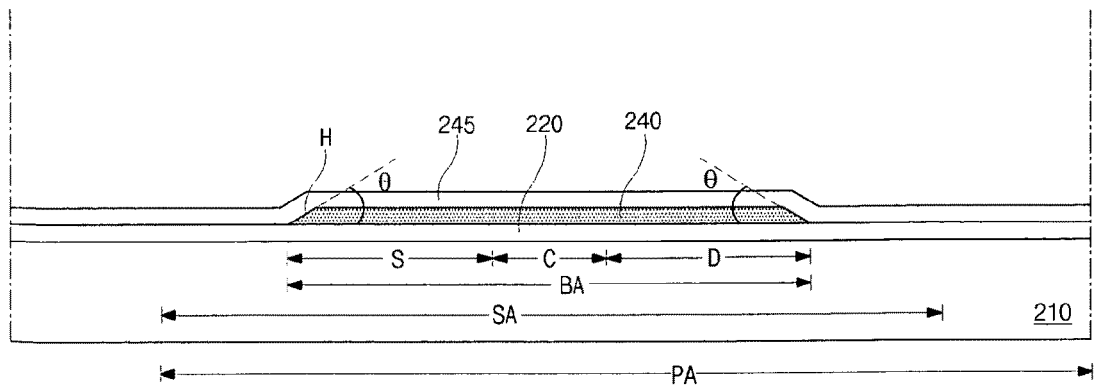
Figure 7H:
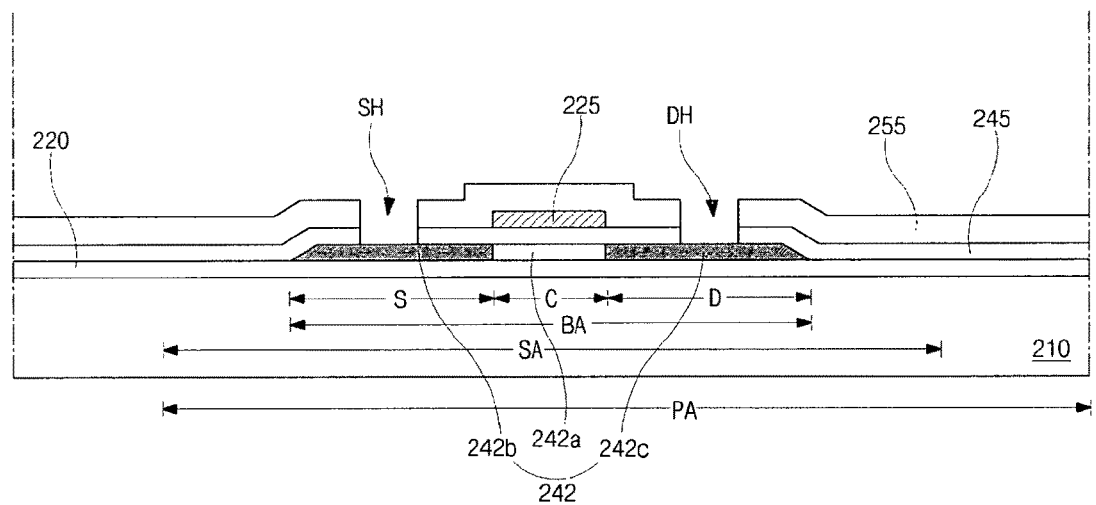

In FIG. 7E, the polycrystalline silicon layer 240b is patterned using the PR pattern 262 as an etch mask through a first dry etch step, which is a preparation step for forming a tapered shape of the semiconductor layer 242 (of FIG. 7H). A plasma dry etching method using first reaction gases, such as carbon tetrafluoride ($CF_4$), oxygen ($O_2$) and argon (Ar), may be applied to the first dry etch step. For example, when the polycrystalline silicon layer 240b has a thickness of about 2000 Angstroms (Å), the first dry etching step may have process conditions such as a pressure of about 50 mT to about 100 mT, a power of about 3000 W, a carbon tetra fluorine ($CF_4$) flow rate of about 200 sccm to about 600 sccm, an oxygen ($O_2$) flow rate of about 500 sccm to about 800 sccm and an etch rate of about 510 Å/min to about 1200 Å/min for the polycrystalline silicon layer 240b. During the first dry etch step using the first reaction gases, such as carbon tetra fluorine ($CF_4$), oxygen ($O_2$) and argon (Ar), the PR pattern 162, the polycrystalline silicon layer 240b and the buffer layer 220 have different etch rates. For example, the etch rate of photoresist for the first reaction gases of carbon tetra fluorine ($CF_4$), oxygen ($O_2$) and argon (Ar) may be greater than the etch rate of each of silicon (Si), silicon oxide ($SiO_2$) and silicon nitride ($SiN_x$). As a result, the PR pattern 262 may have a first etch rate, and the polycrystalline silicon layer 240b and the buffer layer 220 may have a second etch rate smaller than the first etch rate. Since the polycrystalline silicon layer 240b is etched more slowly than the PR pattern 262 during the first dry etch step, the polycrystalline silicon layer 240b is etched such that a thickness of the removed polycrystalline silicon layer 240b is smaller than a thickness of the removed PR pattern 262.

In FIG. 7F, while a portion of the PR pattern 262 having a first thickness t1 is removed to form a remaining PR pattern 263, a portion of the polycrystalline silicon layer 240b having a second thickness t2 smaller than the first thickness t1 (t2<t1) is removed after the first dry etch step. Since a portion of the polycrystalline silicon layer 240b under the removed portion of the PR pattern 262 is exposed to the first reaction gases for different etch time periods according to a distance from an edge of the remaining PR pattern 263, the portion of the polycrystalline silicon layer 240b under the removed portion of the PR pattern 262 has a slant surface having different thicknesses. For example, the slant surface may correspond to an oblique side of a right triangle having a bottom side of the first thickness t1 and a height of the second thickness t2. Further, the second thickness t2 may be within a range of about 70% to about 90% of an original thickness of the polycrystalline silicon layer 240b. For example, the polycrystalline silicon layer 240b having the second thickness t2 that is about 80% of the original thickness may be removed during the first dry etch step.

After the first dry etch step, the polycrystalline silicon layer 240b is patterned using the remaining PR pattern 263 as an etch mask through a second dry etch step. A plasma dry etching method using second reaction gases such as sulfur hexafluoride ($SF_6$), chlorine ($Cl_2$) and argon (Ar), may be applied for the second dry etch step. During the second dry etch step using the second reaction gases of sulfur hexafluoride ($SF_6$), chlorine ($Cl_2$) and argon (Ar), the remaining PR pattern 263, the polycrystalline silicon layer 240b and the buffer layer 220 have different etch rates. For example, the remaining PR pattern 263 and the buffer layer 220 may have a third etch rate, and the polycrystalline silicon layer 240b has a fourth etch rate greater than the third etch rate. As a result, the remaining PR pattern 263 and the buffer layer 220 are slowly etched, and the polycrystalline silicon layer 240b is quickly etched. In addition, the third etch rate of the second etch step may be smaller than the first etch rate of the first etch step, and the fourth etch rate of the second etch step may be substantially the same as the second etch rate of the first etch step.

The etch time period for the second etch step is determined by the thickness of a remaining portion of the polycrystalline silicon layer 240b. For example, the second etch step may be performed for several seconds so that the slant surface of the polycrystalline silicon layer 240b can be kept. After the polycrystalline silicon layer 240b is patterned through the second etch step, the remaining PR pattern 263 may be removed by an ashing method or a stripping method. The plurality of protrusions P under the remaining PR patterns 263 may be eliminated through the step of removing the remaining PR pattern 263 by the ashing method or the stripping method to obtain a flat top surface.

In FIG. 7G, an active layer 240 having an island shape is formed on the buffer layer 220 by patterning the polycrystalline silicon layer 240b (of FIG. 7F) through the first and second etch steps. The active layer 240 corresponds to the semiconductor area BA and has edge portions with a tapered shape of a relatively slow slope. The tapered shape has a taper angle θ between side and bottom surfaces of the active layer 240 within a range of about 1 degree to about 30 degrees. For example, the active layer 240 may have a taper angle θ of about 10 degrees to about 15 degrees that depends on the first and second thicknesses t1 and t2 (of FIG. 7F).

Next, a gate insulating layer 245 of an inorganic insulating material, such as silicon oxide ($SiO_2$) or silicon nitride (SiNx), is formed on an entire surface of the substrate 210 having the buffer layer 220 and the active layer 240 by a plasma chemical vapor deposition (PCVD) method using reaction gases, such as mono silane ($SiH_4$) or tetraethylorthosilicate (TEOS). Since the active layer 240 has a tapered shape of a relatively slow slope with a taper angle of about 1 degree to about 30 degrees, a step coverage of the gate insulating layer 245 at the edge portions of the active layer 240 is improved such that the gate insulating layer 245 has substantially the same thickness over the active layer 240 including a slant surface H of the edge portion. As a result, properties of a TFT T (of FIG. 7I) are improved such that breakdown voltage increases and leakage current decreases.

In FIG. 7H, a gate electrode 225 and a gate line (not shown) are formed on the gate insulating layer 245 by depositing and patterning one of copper (Cu), molybdenum (Mo), aluminum (Al) and aluminum alloy. The gate electrode 225 is connected to the gate line and corresponds to the active layer 240 in the channel area C, and a gate signal is applied to the gate electrode 225 through the gate line.

Although not shown in FIG. 7H, a semiconductor layer 242 is formed by doping the active layer 240 corresponding to the source and drain areas S and D with impurities of one of a negative type and a positive type using the gate electrode 225 as a doping mask. As a result, the semiconductor layer 242 includes a channel region 242a that does not have the impurities and first and second doped regions 242b and 242c having the impurities. The channel region 242a corresponds to the gate electrode 225 and the first and second doped regions 242b and 242c are disposed at both sides of the channel region 242a.

Next, a passivation layer 255 is formed on the gate electrode 225 by depositing one of an inorganic insulating material, such as silicon oxide ($SiO_2$) or silicon nitride (SiNx), and an organic insulating material such as photo acryl and benzocyclobutene (BCB). Alternatively, the passivation layer 255 may have a double-layered structure including, for example, a first layer of silicon nitride (SiNx) and a second layer of silicon oxide ($SiO_2$). Next, a source hole SH and a drain hole DH are formed in the passivation layer 255 and the gate insulating layer 245 by patterning. The source hole SH and the drain hole DH expose the first doped region 242b and the second doped region 242c, respectively, of the semiconductor layer 242.

Figure 7I:
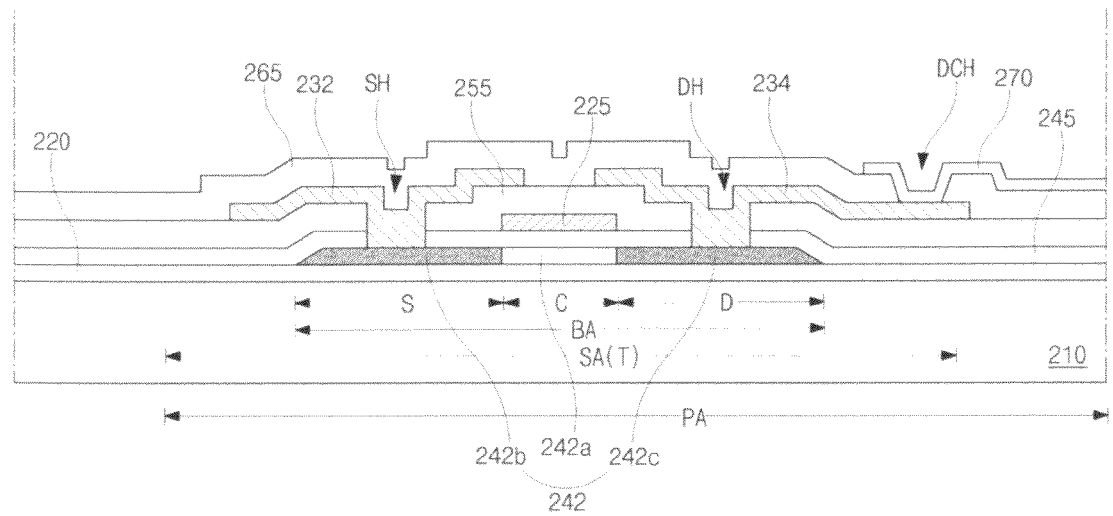

In FIG. 7I, a data line (not shown), a source electrode 232 and a drain electrode 234 are formed on the passivation layer 255. The data line crosses the gate line to define the pixel region PA. The source electrode 232 extends from the data line and the drain electrode 234 is spaced apart from the source electrode 232. The source electrode 232 is connected to the first doped region 242b of the semiconductor layer 242 through the source hole SH, and the drain electrode 234 is connected to the second doped region 242c of the semiconductor layer 242 through the drain hole DH.

Next, an interlayer insulating layer 265 is formed on the data line, the source electrode 232 and the drain electrode 234. The interlayer insulating layer 265 has a drain contact hole DCH exposing the drain electrode 234. The interlayer insulating layer 265 includes one of an inorganic insulating material, such as silicon oxide ($SiO_2$) or silicon nitride (SiNx), and an organic insulating material, such as photo acryl or benzocyclobutene (BCB). Next, a pixel electrode 270 is formed on the interlayer insulating layer 265 in the pixel region PA by depositing and patterning a transparent conductive material, such as indium-tin-oxide (ITO) or indium-zincoxide (IZO). The pixel electrode 270 is connected to the drain electrode 234 through the drain contact hole DCH.

Since the plurality of protrusions generated at grain boundaries of the polycrystalline silicon layer 240b by an ELA method are removed through the BOE treatment step and the semiconductor layer 240 has a tapered shape of a relatively slow slope through the first and second etch steps, the step coverage of the gate insulating layer 245 is improved. As a result, electric properties of the TFT T are improved such that the breakdown voltage increases and the leakage current decreases.

The TFT and the method of fabricating the TFT according to the present invention may be applied to a semiconductor device including a TFT, such as a liquid crystal display (LCD) device or an organic electroluminescent display (OELD) device. In addition, the TFT and the method of fabricating the TFT according to the present invention may be applied to an amorphous silicon active layer as well as a polycrystalline silicon active layer.

It will be apparent to those skilled in the art that various modifications and variations can be made in a thin film transistor and a method of fabricating the thin film transistor of the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor, comprising:
    forming a silicon layer on a substrate;
    forming a photoresist layer on a portion of the silicon layer;
    performing a first etch process of the photoresist layer and the silicon layer using first reaction gases, wherein the etch rate of the photoresist is greater than that of the silicon layer in the first etch process, and wherein a portion within a range of about 70% to about 90% of the silicon layer is removed through the first etch process;
    performing a second etch process of the photoresist layer and the silicon layer using second reaction gases different from the first reaction gases, wherein the etch rate of the silicon layer is greater than that of the photoresist in the second etch process, and wherein the first and second etch processes form an active layer having an island shape with tapered edge portions and exposing adjacent portions of the substrate;
    removing the remaining photoresist layer remaining after the first and second etch processes;
    forming a gate insulating layer on the active layer and the substrate;
    forming a gate electrode on the gate insulating layer over the active layer; and
    implanting impurities into the active layer to define source and drain regions and to define a channel region under the gate electrode.

2. The method according to claim 1, wherein the substrate includes a buffer layer at an upper surface thereof, and wherein the step of forming the silicon layer forms the silicon layer directly on the buffer layer.

3. The thin film transistor according to claim 1, wherein the tapered edge portions have a relatively slow slope.

4. The thin film transistor according to claim 1, wherein a taper angle between the tapered edge portions and a surface of the substrate is less than about 30 degrees.

5. The thin film transistor according to claim 4, wherein the taper angle is between about 10 degrees to about 15 degrees.

6. The thin film transistor according to claim 1, further comprising steps of:
    forming an passivation layer on the gate electrode and the gate insulating layer;
    forming a source electrode in contact with the source region via a first contact hole through the passivation layer; and
    forming a drain electrode in contact with the drain region via a second contact hole through the passivation layer.

7. The method according to claim 1, wherein the step of forming the silicon layer includes forming a layer of amorphous silicon on the substrate and crystallizing the amorphous silicon to form a polycrystalline silicon thin film.

8. The method according to claim 7, wherein the amorphous silicon layer is crystallized using one of a solid phase crystallization (SPC) method, a sequential lateral solidification (SLS) method, a metal induced crystallization (MIC) method, and an alternative magnetic lateral crystallization (AMLC) method.

9. The method according to claim 7, wherein the amorphous silicon layer is crystallized using an excimer laser annealing (ELA) method, the ELA method applying a buffer oxide etchant (BOE) to the polycrystalline silicon layer after laser annealing to remove any protrusions present on the polycrystalline silicon layer.

10. The method according to claim 1, wherein, in the implanting step, the gate is used as a mask for the channel region.

11. The method according to claim 1, wherein the step of performing the first etch process includes a plasma dry etch process using first reaction gases of carbon tetra fluoride ($CF_4$), oxygen ($O_2$) and argon (Ar), and wherein the step of performing the second etch process includes a plasma dry etch process using second reaction gases of sulfur hexafluoride ($SF_6$), chlorine ($Cl_2$) and argon (Ar).

12. A method of fabricating an array substrate for a liquid crystal display device, comprising:
    forming a silicon layer on a substrate;
    forming a photoresist layer on a portion of the silicon layer;
    performing a first etch process of the photoresist layer and the silicon layer using first reaction gases, wherein the etch rate of the photoresist is greater than that of the silicon layer in the first etch process, and wherein a portion within a range of about 70% to about 90% of the silicon layer is removed through the first etch process;
    performing a second etch process of the photoresist layer and the silicon layer using second reaction gases different from the first reaction gases, wherein the etch rate of the silicon layer is greater than that of the photoresist in the second etch process, and wherein the first and second etch processes form an active layer having an island shape with tapered edge portions and exposing adjacent portions of the substrate;
    removing the remaining photoresist layer remaining after the first and second etch processes;
    forming a gate insulating layer on the active layer and the substrate;

forming a gate line and gate electrode on the gate insulating layer, the gate electrode disposed over the active layer and connected to the gate line;

implanting impurities into the active layer to define source and drain regions and to define a channel region under the gate electrode;

forming an passivation layer on the gate electrode and the gate insulating layer;

forming a data line, a source electrode and a drain electrode, the source electrode in contact with the source region via a first contact hole through the passivation layer; and forming an interlayer insulating layer on the data line, the source electrode and the drain electrode; and forming a pixel electrode on the interlayer insulating layer, the pixel electrode being connected to the drain electrode through the drain contact hole of the interlayer insulating layer.

13. The method according to claim 12, wherein the substrate includes a buffer layer at an upper surface thereof, and wherein the step of forming the silicon layer forms the silicon layer directly on the buffer layer.

* * * * *